United States Patent
Nakamura et al.

(10) Patent No.: US 9,588,143 B2
(45) Date of Patent: Mar. 7, 2017

(54) RESISTOR FOR DETECTING CURRENT

(71) Applicant: KOA CORPORATION, Ina-shi, Nagano (JP)

(72) Inventors: Keishi Nakamura, Ina (JP); Koichi Hirasawa, Ina (JP)

(73) Assignee: KOA CORPORATION, Ina-shi (JP)

(*) Notice: Subject to any disclaimer, the term of this patent is extended or adjusted under 35 U.S.C. 154(b) by 58 days.

(21) Appl. No.: 14/425,765

(22) PCT Filed: Aug. 21, 2013

(86) PCT No.: PCT/JP2013/072236
§ 371 (c)(1),
(2) Date: Mar. 4, 2015

(87) PCT Pub. No.: WO2014/045786
PCT Pub. Date: Mar. 27, 2014

(65) Prior Publication Data
US 2015/0226768 A1    Aug. 13, 2015

(30) Foreign Application Priority Data
Sep. 19, 2012    (JP) ................. 2012-205811

(51) Int. Cl.
*G01R 1/20*    (2006.01)
*G01R 19/00*    (2006.01)

(52) U.S. Cl.
CPC ......... *G01R 1/203* (2013.01); *G01R 19/0092* (2013.01)

(58) Field of Classification Search
CPC .......... G01R 1/203; G01R 19/92; H01C 1/14; H01C 1/08

(Continued)

(56) References Cited

U.S. PATENT DOCUMENTS

| 5,198,794 A | * | 3/1993 | Sato | ........................ | H01C 17/24 219/121.68 |
| 2003/0020592 A1 | * | 1/2003 | Hirasawa | ............... | G01R 1/203 338/49 |

(Continued)

FOREIGN PATENT DOCUMENTS

| JP | 6-186254 A | 7/1994 |
| JP | 2002-372550 A | 12/2002 |

(Continued)

OTHER PUBLICATIONS

International Search Report dated Nov. 26, 2013, issued in corresponding application No. PCT/JP2013/072236.

*Primary Examiner* — Tung X Nguyen
*Assistant Examiner* — Dominic Hawkins
(74) *Attorney, Agent, or Firm* — Westerman, Hattori, Daniels & Adrian, LLP

(57) ABSTRACT

Provided is a resistor for detecting current, which includes a voltage terminal member capable of removing an influence of error voltage, formed by tiny amount of self inductance existing in the resistor. The voltage terminal member includes a resistance body (11); a pair of electrodes (12) fixed to each end of the resistance body; and a pair of voltage terminal members (3) for detecting voltage generated in the resistance body and that are connected to each electrode; wherein the voltage terminal member (3) includes a connecting portion (3b) for connecting to the electrode (12), an extending portion (3c1,3c2) extending from the connecting portion toward the other electrode side; and wherein each end of the extending portion reaches to same plane (X) perpendicular to current path between the electrodes.

5 Claims, 8 Drawing Sheets

(58) Field of Classification Search
USPC .................................. 324/126, 76, 115, 149
See application file for complete search history.

(56) References Cited

U.S. PATENT DOCUMENTS

| | | | |
|---|---|---|---|
| 2005/0024806 A1 | 2/2005 | Hirasawa | |
| 2006/0220740 A1* | 10/2006 | Bessho | H03F 3/45475 |
| | | | 330/252 |
| 2007/0177318 A1* | 8/2007 | Oman | G01R 1/203 |
| | | | 361/58 |
| 2009/0174522 A1* | 7/2009 | Schulz | G01R 1/203 |
| | | | 338/49 |
| 2010/0328021 A1* | 12/2010 | Hirasawa | H01C 1/028 |
| | | | 338/226 |
| 2011/0089931 A1* | 4/2011 | Podlisk | G01R 1/203 |
| | | | 324/126 |
| 2012/0229247 A1* | 9/2012 | Yoshioka | G01R 1/203 |
| | | | 338/49 |

FOREIGN PATENT DOCUMENTS

| | | |
|---|---|---|
| JP | 2002-372551 A | 12/2002 |
| JP | 2003-121477 A | 4/2003 |
| JP | 2003-121481 A | 4/2003 |
| WO | 2011/068205 A1 | 6/2011 |

\* cited by examiner

Voltage between A'B' = R·I + ( L−M )·dI/dt
= R·I + Le·dI/dt

Assuming $Zin >> |R+j\omega Le|$ $Vout \approx I \times (R+j\omega Le) \times \dfrac{1/(j\omega C)}{r+ 1/(j\omega C)} = I \times R \times \dfrac{1+j\omega Le/R}{1+j\omega C \times r}$ When $Le/R = C \times r$  Then  $Vout = I \times R$

RESISTOR FOR DETECTING CURRENT

TECHNICAL FIELD

The present invention relates to a resistor for detecting current, and particularly relating to the resistor including a voltage terminal member, which takes out voltage formed between both ends of resistance body by the current to be watched flowing through the resistor.

BACKGROUND ART

The resistor for current detection has been used for a purpose of watching charge and discharge current of a battery, and controlling the charge and discharge current of the battery etc. The resistor is inserted in the route of the current to be watched. And, the voltage generated at both ends of the resistor is detected and the current is detected from already-known resistance value. A structure of voltage detection circuit for taking out the voltage formed between both ends of the resistor has been proposed in Japanese laid-open patent publication 2003-121481.

In the publication, it is described that an error voltage is caused by tiny amount of self inductance existing in a surface mount type resistor for detecting current, and the error voltage can be cancelled by voltage caused by mutual inductance formed on voltage detection wiring structure disposed along central axis of the resistor. Thus, according to the wiring structure, the error voltage basing on the self inductance of the resistor can be prevented from influencing detected voltage of the resistor (see FIG. 3, paragraph 0016-0021).

However, the resistor for detecting large current is generally large in the size, and it might be not capable for surface-mounting the resistor on voltage detection circuit board etc. Thus, there are cases that application of the wiring structure as above-mentioned becomes difficult.

SUMMARY OF INVENTION

Technical Problem

The invention has been made basing on above-mentioned circumstances. Therefore, object of the invention is to provide a resistor including a voltage terminal member capable of removing influence of the error voltage caused by tiny self inductance existing in the resistor.

Solution to Problem

The resistor of the invention includes a resistance body, a pair of electrodes fixed to each end of the resistance body, and a pair of voltage terminal members for detecting voltage generated in the resistance body and that are connected to each electrode. The voltage terminal member includes a connecting portion for connecting to the electrode, and an extending portion extending from the connecting portion toward the other electrode side. An end of each extending portion reaches to a same plane perpendicular to the current path between the electrodes.

According to the invention, since the voltage terminal member includes a connecting portion to the electrode, and an extending portion extending from the connecting portion toward the other electrode side, and an end of each extending portion reaches to a same plane perpendicular to the current path between the electrodes, then voltage terminal portions formed at each end of the extending portions can be disposed in a same plane perpendicular to the current path. Therefore, magnetic flux $\phi$ generated by the current to be watched flowing through the resistance body, is formed in direction of circumference around the current, then it does not interlink to the same plane, which includes the pair of voltage terminal portions. Thus, if a loop including voltage terminal portions changes according to connection situations etc., since the loop does not interlink to the magnetic flux $\phi$, then effective inductance Le does not change, and the error voltage caused by self inductance L existing in the resistor can be compensated by the low pass filter having a time constant.

DESCRIPTION OF EMBODIMENTS

Figure 1:
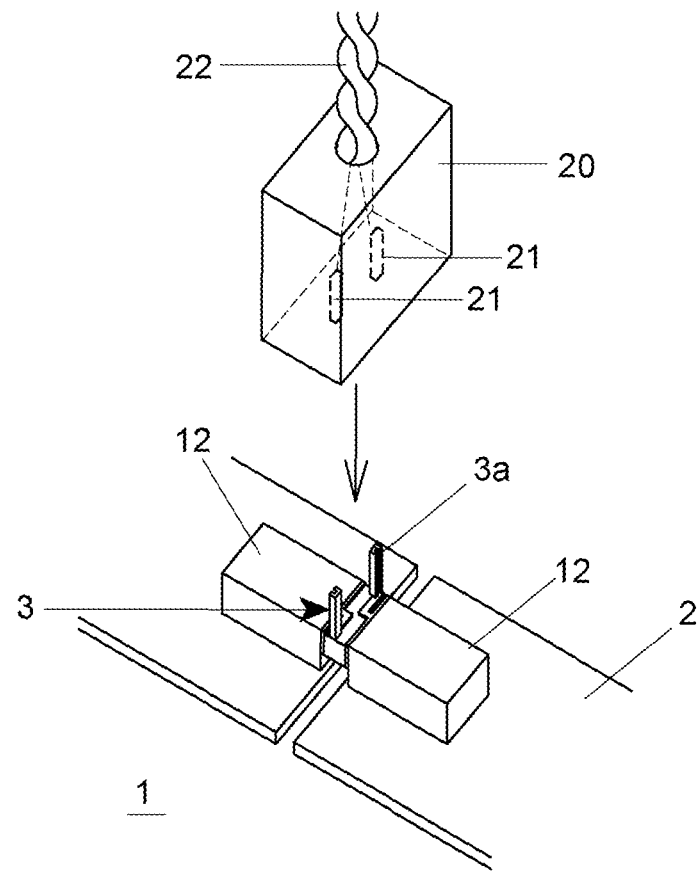
FIG. 1 is a perspective view, which shows a mounted state of the resistor of an embodiment of the invention.

Embodiments of the invention will be described below with referring to FIG. 1 through FIG. 12. Like or corresponding parts or elements will be denoted and explained by same reference characters throughout views.

FIG. 1 shows a mounted state of the resistor for detecting current of an embodiment of the invention. The resistor includes a columnar resistance body 11 consisting of resistive alloy material such as Cu—Mn—Ni system alloy, or Cu—Ni system alloy etc., a pair of square pillar electrodes 12 of another material to the resistance body consisting of highly conductive metal material such as copper etc. (see FIG. 9), and a pair of voltage terminal members 3 for detecting voltage generated in the resistance body and these are connected to each electrode. The resistor is fixed to wiring pattern 2 on aluminum substrate 1 by solder joint etc. in the embodiment.

The voltage terminal member 3 includes a voltage terminal portion 3a erecting between both electrodes 12 perpendicular to substrate 1, and the portion 3a is able to connect to connecting terminal 21 formed inside of the connector 20. The connecting terminal 21 is connected to strand wire 22, and further connected to voltage detection circuit (not shown). That is, the voltage generated by current to be watched flowing through resistance body 11 is transmitted to voltage detection circuit through voltage terminal member 3 connected to each electrode 12, connecting terminal 21 inside of connector 20, and strand wire 22. Then, the voltage is detected, and current value is detected basing on known resistance value.

Figure 2:
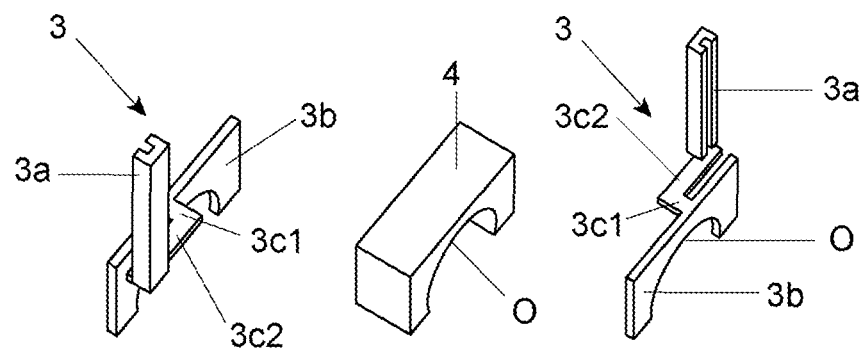
FIG. 2 is an exploded perspective view of the voltage terminal member.

FIG. 2 shows an example of voltage terminal member including voltage terminal portion. Voltage terminal member 3 includes a connecting portion 3b, which connects to an end face of electrode 12 of resistance body side, a first extending portion 3c1 extending from the connecting portion toward the other electrode side, a second extending portion 3c2 extending from the first extending portion in right-angled direction to direction where the electrodes are disposed, and a voltage terminal portion erecting vertically on end of the second extending portion. Concave portion O is formed in connecting portion 3b for resistance body to be fit into.

The insulative material 4 is inserted between the pair of connecting portions 3b of voltage terminal members so as to isolate the pair of the voltage terminal members. The concave portion O is formed so as to allow the resistance body to be fit into. The pair of voltage terminal members 3 is fixed to insulative member 4 so as to make voltage terminal portion 3a positioning inside with using adhesive etc. At the time, lengths of first extending portion 3c1 and second extending portion 3c2 are adjusted so that each of the pair of the connecting portions 3a is positioned at both sides in width direction between both electrodes 12 and at center between both electrodes 12. Further, insulative material 4 is made of glass-epoxy substrate, for example.

Figure 3:
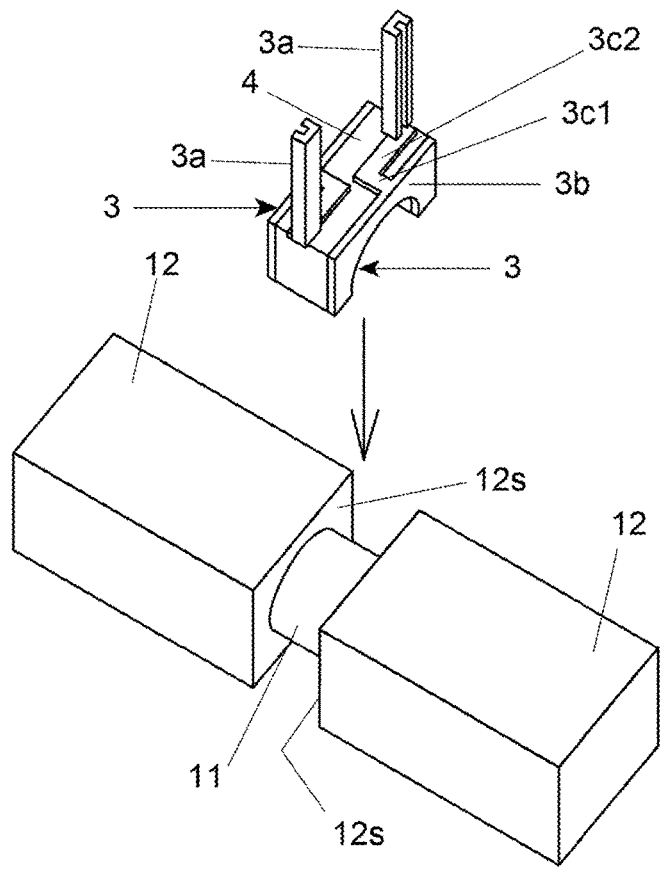
FIG. 3 is an exploded perspective view, which shows a state of installing the voltage terminal member and the insulative member to the resistor.

FIG. 3 shows a state that the voltage terminal members and the insulative member are integrated and installed into the resistor. The insulative member 4 intervening between pair of voltage terminal members 3 is inserted into between opposite end faces 12s of electrodes 12 and fixed, where outer circumferences of resistance body 11 and inner circumference of concave portion O of insulative material 4 are matched. Accordingly, since connecting portion 3b of voltage terminal member 3 abuts to end face 12s of electrode 12 of resistance body side, influence of resistance in the electrode 12 becomes very small, and high accuracy voltage detection can be possible basing on real resistance value of the resistor.

The voltage terminal member 3 includes connecting portion 13b for abutting to end face 12s of electrode 12 of resistance body side, first extending portion 3c1 extending from the connecting portion 13b toward other electrode side, second extending portion 3c2 extending from end of first extending portion in right-angled direction to direction where the electrodes are disposed, and voltage terminal portion 3a erecting vertically on end of the second extending portion.

Figure 4:
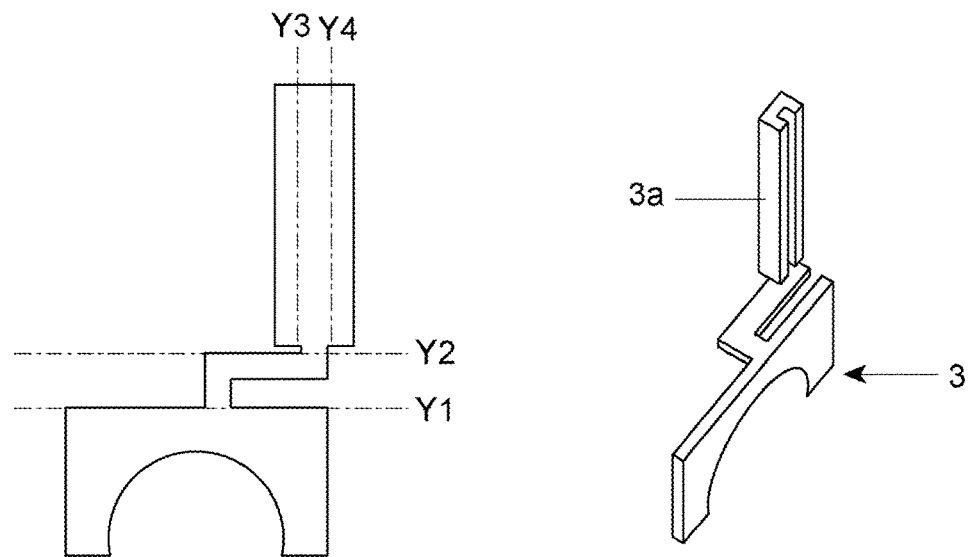
FIG. 4 is a plan view and a perspective view, which shows method for forming the voltage terminal member.

FIG. 4 shows method for forming the voltage terminal member. First, copper plate etc. is pierced and metal plate material having the shape, which is shown in left view, is formed. And, the plate material is bent into right-angle along folding line Y1, and is bent toward opposite direction into right-angle along folding line Y2. Further, the plate material is again bent into right-angle along folding lines Y3 and Y4 toward same direction. As a result, as shown in right view, the voltage terminal member 3 is formed including the voltage terminal portion 3a, which can be inserted into connecting terminal 21 of connector 20.

Figure 5A:
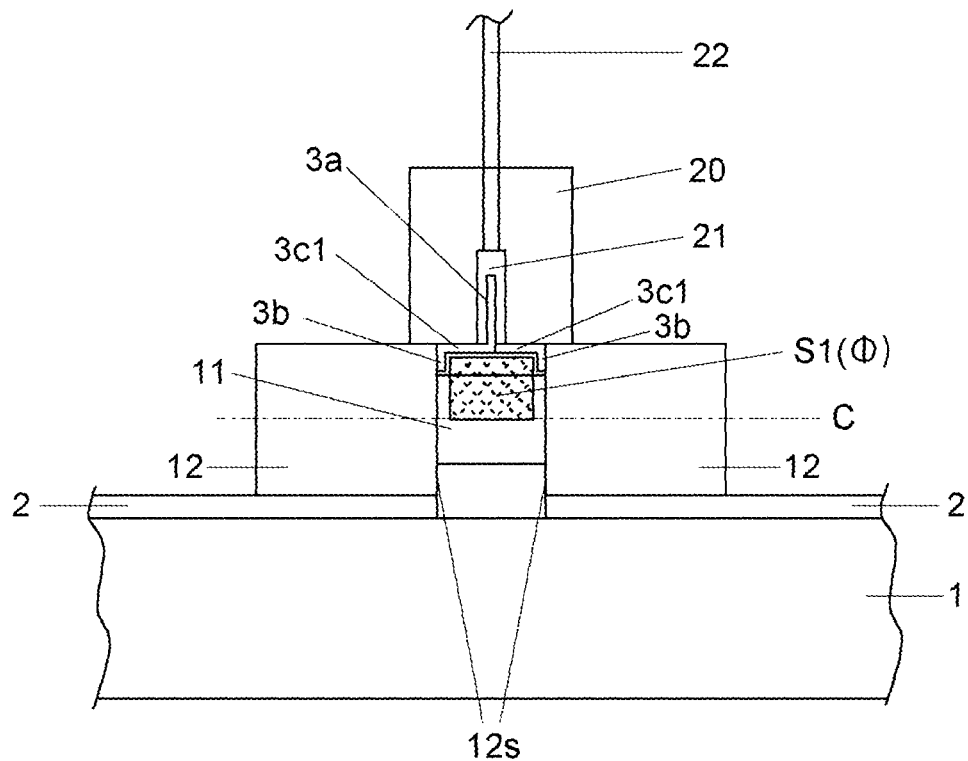
FIG. 5A is a rough front view (partial cross section view) of the resistor including voltage terminal members at mounted state.
Figure 5B:
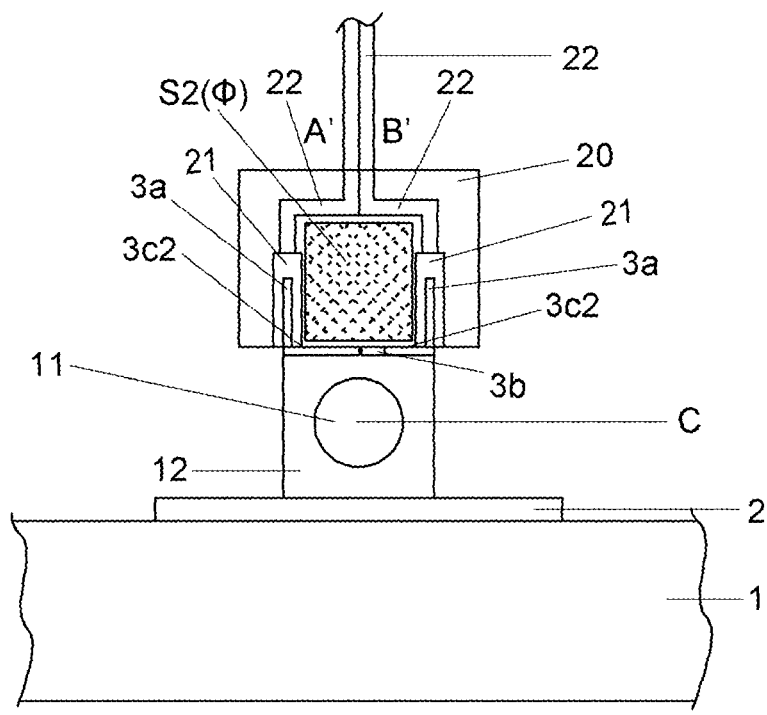
FIG. 5B is a rough side view (partial cross section view) of the resistor including voltage terminal members at mounted state.
Figure 5C:
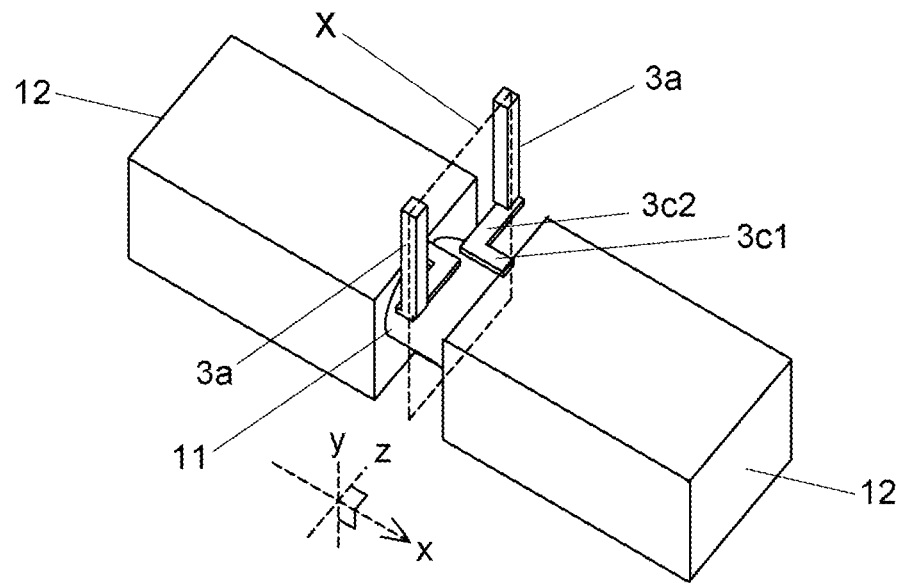
FIG. 5C is a perspective view of main portion of the resistor.

FIG. 5A shows rough front view (partial cross-section) of the resistor at mounted state, FIG. 5B shows its rough side view (partial cross-section), and FIG. 5C shows its essential portion. The pair of electrodes 12 of the resistor is fixed on the wiring pattern 2 on the aluminum substrate 1. The end face of columnar (circle in cross-section) resistance body 11 is abutted to square pillar (rectangular in cross-section) electrode 12 at its center of the end face, and bonded by welding.

The connecting portion 3b of the voltage terminal member 3 is fixed to end face 12s of electrode 12 of resistance body side, and first extending portion 3c1 is extending to roughly center position between the electrodes 12. And, second extending portion 3c2 is extending in right-angled direction to direction where the electrodes 12 are disposed, and voltage terminal portion 3a is erecting vertically on its end. Accordingly, both voltage terminal portions 3a are disposed at center position between the electrodes 12, and disposed in the same plane X, which is perpendicular to the current path (see FIG. 5C).

That is, in FIG. 5C, character X denotes the plane perpendicular to the current path between the electrodes 12. The extending portion of voltage terminal member 3, that is, each end of first extending portions 3c1 and/or each end of second extending portions 3c2 reaches to the same plane X perpendicular to the current path between the electrodes 12. And, each voltage terminal portion 3a is erecting in the same plane X. Here, current path means main path of current in the resistance body of the resistor, that is, the resistance body in its axial direction itself. Further, the axial direction of the resistance body 11 is coincidence with x axis of the coordinate axis in FIG. 5C-FIG. 5E. And, the plane X is formed by y-axis and z-axis, which are perpendicular to x-axis.

Figure 5D:
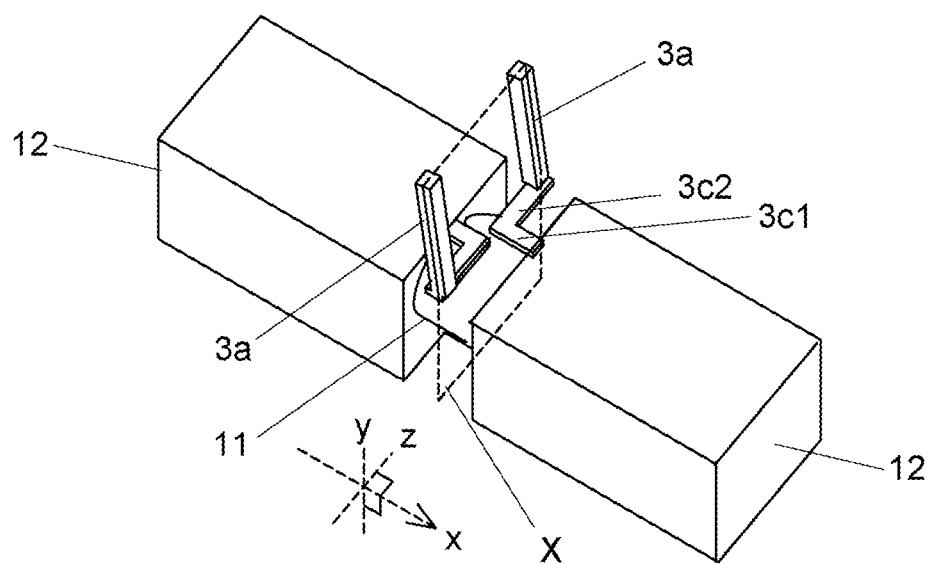
FIG. 5D is a perspective view of a variation of the voltage detection portion in FIG. 5C.
Figure 5E:
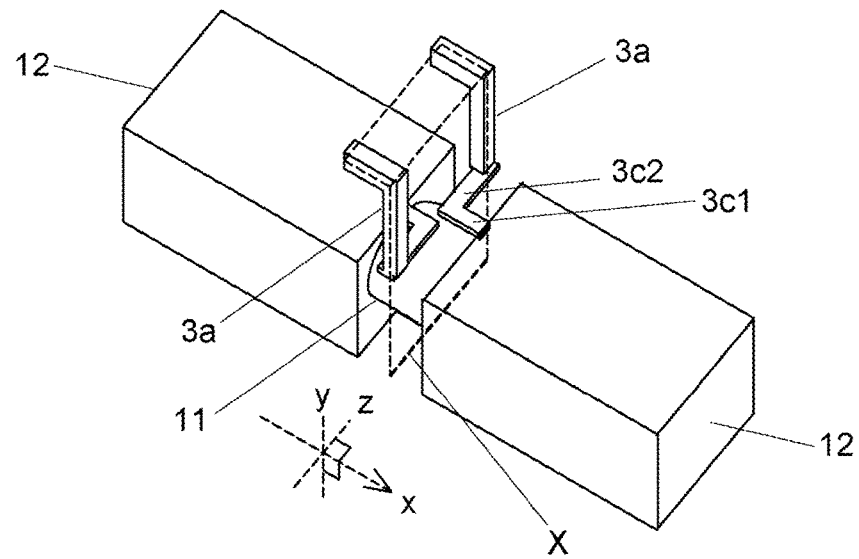
FIG. 5E is a perspective view of another variation of the voltage detection portion in FIG. 5C.

Further, the voltage terminal portion 3a may not be erected in the plane X, which is perpendicular to the current path. For example, FIG. 5D shows an example that the pair of voltage detection terminals 3a has been inclined at same angle to the plane X. And, FIG. 5E shows another example, where upper portion of the pair of voltage detection terminals 3a is folded at same angle roughly in right-angle to the plane X. If it is necessary to fold upper portion of the pair of voltage detection terminals 3a, it is preferable to fold them at a distance away from the resistance body.

In the example shown in FIG. 5D, the pair of voltage detection terminals 3a is positioned in a same plane, which has same inclination to plane X perpendicular to current path, where a line parallel to z-axis is as rotation center. When saying it in other words, each of the pair of voltage terminal portions 3a is inclined basing on a line existing in plane X perpendicular to current path, so as to form left and right symmetric loop. As to the example in FIG. 5E, upper portion of the pair of voltage terminal portions 3a is positioned in the same plane perpendicular to plane X at a line parallel to z-axis as rotation center. As described later, since, magnetic flux φ, which is generated around the current flowing through the resistance body, does not interlink to those planes, thus the electromotive force is not caused in the pair of voltage detection terminals 3a.

In FIG. 5B, each voltage terminal portion 3a, which erects at both sides in width direction at center position between the electrodes 12, is inserted into connecting portion 21 of connecter 20. Voltage signal detected at both end faces of electrodes 12 is sent from connecting portion 21 of connecter 20, via strand wire 22, to voltage detection circuit, which is not shown, where current value is detected.

Here, magnetic flux ϕ, which is formed by current I flowing through the resistance body 11, interlinks to surface S1 (see FIG. 5A), which is formed by pair of voltage terminal members 3 (connecting portions 3b and first extending portions 3c1) and central axis C of the resistance body 11, where by the magnetic flux ϕ, self inductance L is caused inside of the resistance body 11, and mutual inductance M is caused outside of the resistance body 11. As it is understood from FIG. 5A of front view, each end of first extending portion 3c1 is superposed, and each voltage terminal portion 3a is also superposed. Thus, surface S1 is demarcated by connecting portion 3b and first extending portion 3c1, and becomes without any relation with the voltage terminal portion 3a.

Figure 6:
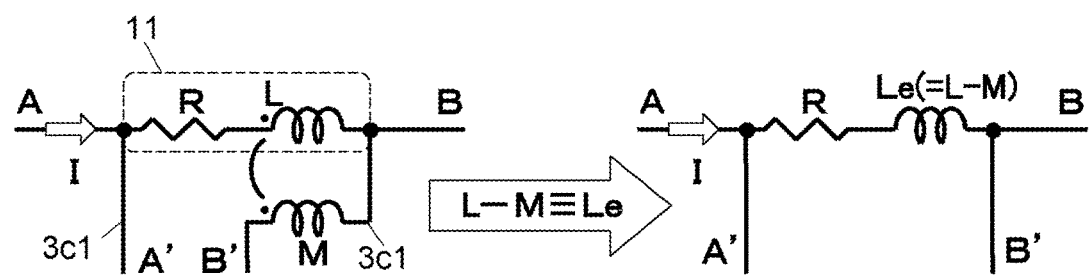
FIG. 6 is an explanatory view of the effective inductance Le.

As shown in FIG. 6, besides detected voltage basing on resistance R of resistance body 11 by current I flowing there-through, an error voltage basing on self inductance L of the resistance body itself and another voltage basing on mutual inductance M of pair of the voltage terminal member 3 (connecting portion 3b and first extending portion 3c1) are superposed. Here, an inductance that see resistance body 11 side from output ends A' and B' of connector 20 becomes L−M, because voltage caused by self inductance L and voltage caused by mutual inductance M are formed by same current I in opposite direction. Thus, it is defined as "effective inductance Le" and it becomes Le=L−M.

On the other hand, as shown in FIG. 5B, equivalent circuit that see resistance body 11 side from output ends A' and B' of connector 20 includes a loop having an area demarcated by a portion of strand wire 22, connecting portion 21 of the connector and the voltage terminal portion 3a, and the second extending portion 3c2.

However, magnetic flux ϕ caused by current I flowing through resistance body 11 is formed in direction of circumference of the resistance body. Because, both voltage terminal portions 3a is positioned in the same plane perpendicular to current path between the electrodes, where the plane has same incrimination as to z axis to be a center of rotation, then the magnetic flux ϕ does not interlink to the loop having the area S2.

Therefore, any change of impedance components does not occur in the loop of the equivalent circuit, which is seen from output ends A' and B' of connector 20. That is, if insertion situation of the connector 20 to the voltage terminal portion 3a is changed and the area S2 is changed, voltage detected at output ends A' and B' of connector 20 is not influenced.

Figure 7:
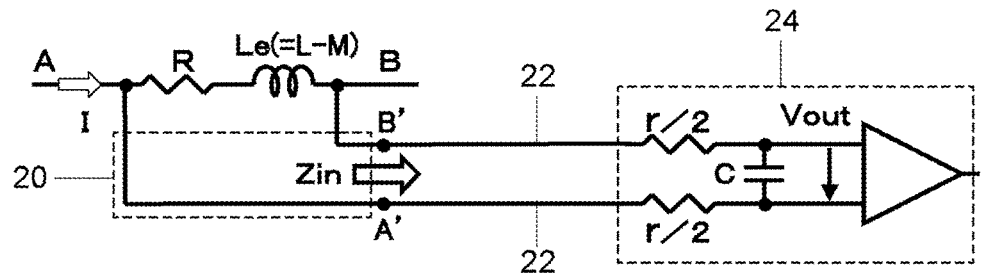
FIG. 7 is an explanatory view, which shows that the error voltage caused by the effective inductance Le can be cancelled by low pass filter intervening thereof.

The invention is to provide the voltage detection circuit, which is able to remove an influence of error voltage caused by self inductance L of resistance body itself, and is able to detect normal voltage basing on resistance R of the resistance body 11. Therefore, as shown in FIG. 7, output of strand wire 22 is connected to the law pass filter 24 of voltage detection circuit. By fixing the effective inductance Le to a constant value, and matching it to circuit constant of the law pass filter, the influence of error voltage can be removed as follows.

FIG. 7 shows the circuit example of law pass filter 24 consisting of resistance r and capacitance C in the voltage detection circuit. The law pass filter 24 is connected to following stage of strand wire 22 of connector 20. Assuming that input impedance Zin of voltage detection circuit, which is seen from output of connector 20, is enough larger than resistor impedance, and assuming that effective impedance Le (=L−M), resistance R of resistance body 11, and capacitance C and resistance r of law pass filter 24, when relationship of Le/R=C·r is obtained, the error voltage according to the effective impedance Le can be cancelled.

That is, the error voltage caused by current I flowing through self inductance L of resistance body 11 is cancelled by mutual inductance M of first extending portion 3c1 and law pass filter 24, and then the error voltage doesn't appear to the output voltage. As a result, only the voltage of product of resistance R of resistance body 11 and current I is taken out to the output voltage.

As a result, when saw tooth-like current flows through the resistor, a large error voltage, which is caused at peak and bottom of the wave shape by self inductance L of the resistor, can be removed. And, normal voltage, which is proportional to saw tooth-like current I by resistance R, can be taken out.

According to the resistor of the invention, not depending on insertion situation of connector 20, area of surface S1 is constant as described above, and effective inductance Le is fixed. Thus, by combining the law pass filter having the circuit constant corresponding to Le, highly accurate detection of current, which includes high frequency components, become possible.

Figure 8:
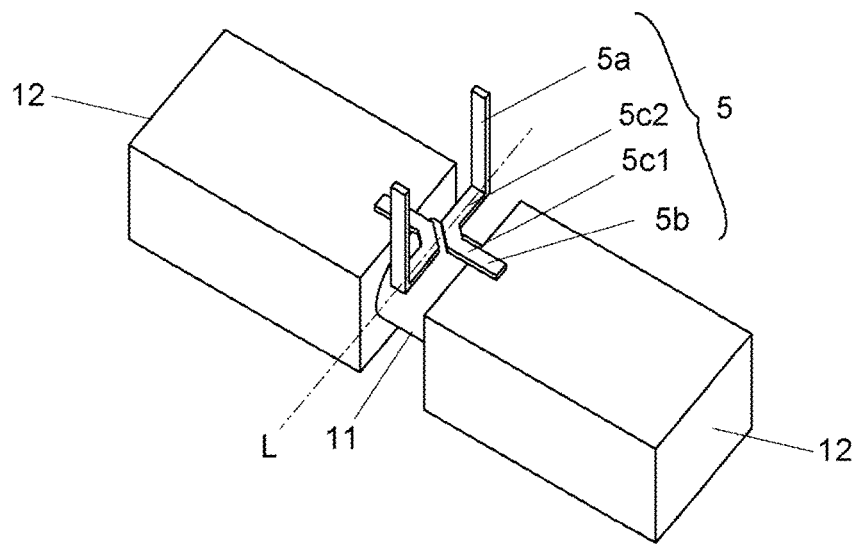
FIG. 8 is a perspective view of the resistor, which uses another voltage terminal member.

FIG. 8 shows another embodiment of the voltage terminal member. Though the structure of the voltage terminal member shown in FIG. 4 is complex, then the structure is simplified. The voltage terminal member 5 includes connecting portion 5b for connecting to electrode 12, first extending portion 5c1 extending toward the other electrode side from the connecting portion, second extending portion 5c2 extending from end of first extending portion in right angled-direction, and voltage terminal portion 5a erecting vertically on end of second extending portion.

Extending portions 5c1, 5c2 are extending toward the other electrode side from connecting portion 5b, reaching to line L, which is positioned at roughly center between the electrodes 12 perpendicular to direction where the electrodes are disposed. The voltage terminal member 5 can be formed easily by piercing the metal sheet etc. and folding the pierced pattern similarly as shown in FIG. 4.

Next, examples of structures of the resistors, which are suitable for detecting current, will be explained. The resistance body of the resistors is characterized to be pillar-shaped having diameter of 4 mm or less between the electrodes. By making the resistance body thin diameter, resistance change ratio by skin effect can be controlled when detecting high frequency current. Thus, highly accurate current detection for current including high frequency components becomes possible. That is, by combining the resistor having excellent frequency characteristics itself, current detection capable of excluding influence of error voltage caused by inductance components becomes possible to higher frequency area.

Figure 9:
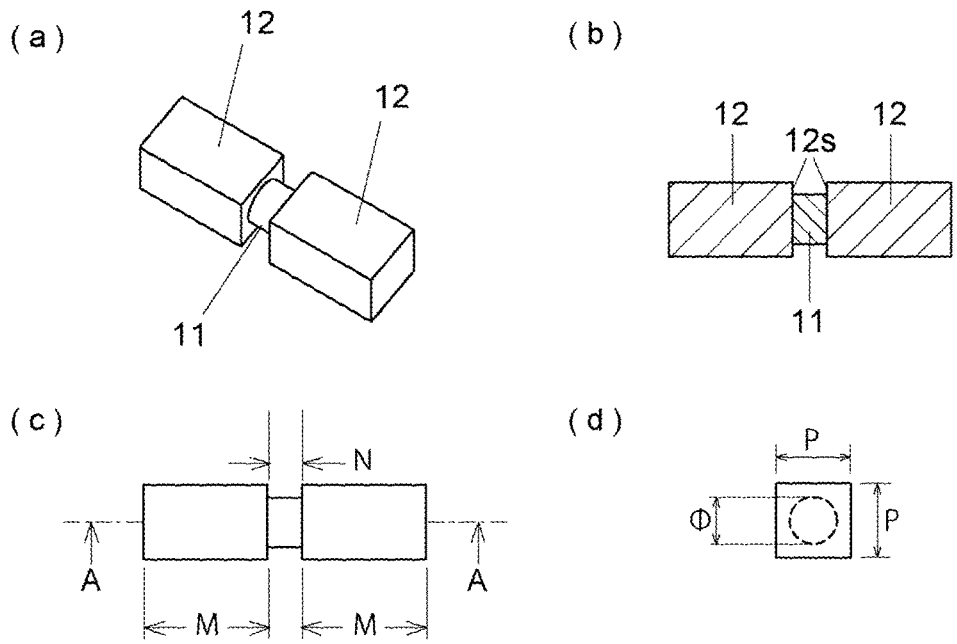
FIG. 9 is an explanatory view of the resistor of first embodiment.

FIG. 9 shows a structure of the resistor of first embodiment. The resistor has resistance body 11 of Cu—Mn—Ni system alloy or Cu—Ni system alloy etc. between the electrodes consisting of Cu etc., and resistance body 11 is configured to be pillar-shaped and having diameter of 4 mm or less. By making resistance body 11 of thin diameter, the resistor becomes possible to detect high frequency current to some degree, as well as DC current, by controlling decrease of current path by skin effect.

As shown in the view, there is a step difference at joint portion between resistance body 11 and each of electrodes 12. As a result, voltage detection terminals can be fixed to end faces 12s of electrodes 12, where resistance body 11 is fixed to the face, and more highly accurate current detection becomes possible basing on real resistance value. Each of electrodes 12 is square pillar-shaped, and resistance body 11 is fixed at roughly center of the electrode 12 in cross-section. By adopting square pillar-shaped electrode, it becomes easy for surface mounting, and convenient for handling when mounting because there is no upper and lower directionality.

Each of electrodes 12 is long in direction where the electrodes are disposed, and is twice longer than distance between electrodes 12, where resistance body 11 is inserted therebetween. As a result, mounting area on circuit patterns can be easily secured, and heat radiation can be improved. Because diameter of resistance body 11 is small, heat radiation from resistance body 11 becomes important for securing durability. And, electrode 12 has larger area in cross-section than area of resistance body 11 in cross-section. As a result, current path narrows gradually from wiring pattern to electrode 12, and to resistance body 11. Then excessive load concentration to resistance body 11 can be suppressed even in case of measuring large current.

Length of resistance body 11 is smaller than 1.5 times its diameter. That is, diameter of resistance body is made to be small, such as 4 mm or less, and the length is shortened as well. As a result, the resistor becomes suitable for detecting large high frequency current, and the resistor becomes low resistance, and miniaturization can be achieved. Further, since diameter of resistance body 11 is small, it becomes strength poverty when lengthening the resistance body too long.

Next, resistance and size of the resistor will be described concretely. Resistance of the resistor is set to be 0.1 mΩ or 0.2 mΩ for designing the product. In case of using Cu—Mn—Ni system alloy wire and setting resistance to be 0.2 mΩ, when diameter ϕ is 1 mm, length N becomes 0.36 mm, when diameter ϕ is 2 mm, length N becomes 1.42 mm, and when diameter ϕ is 3 mm, length N becomes 3.2 mm. That is, length N of the resistance body is made to be shorter than 1.5 times the diameter ϕ.

In case of diameter ϕ being 2 mm and length N being 1.42 mm, (in case of resistance 0.2 mΩ,) length M of electrode 12 in direction, where electrodes are disposed, is 5 mm and width P of electrode is 3 mm. By adopting these sizes, excellent resistance frequency characteristics and excellent heat radiation etc. can be achieved in good balance.

Figure 10:
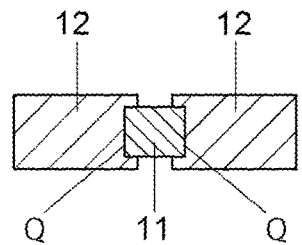
FIG. 10 is an explanatory view of the resistor of second embodiment.

FIG. 10 shows the resistor of second embodiment. Difference point with first embodiment is that electrode 12a has concave portion Q on joint surface with resistance body 11 and end of the resistance body is fitted into the portion Q and fixed. As a result, positioning of the resistance body when manufacturing becomes easy, and joint between resistance body and electrode can be formed more easily.

Figure 11:
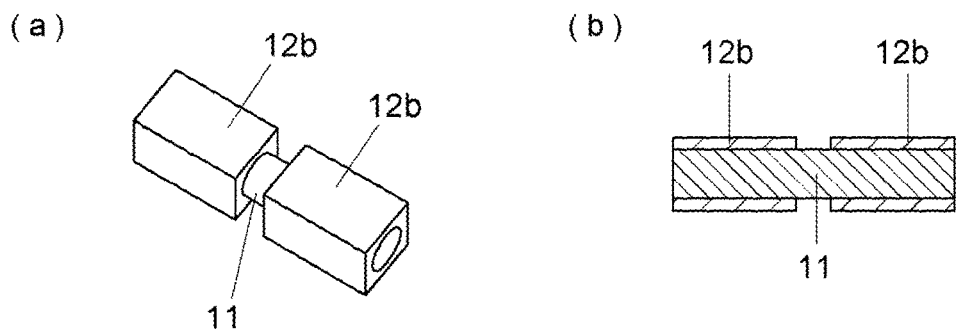
FIG. 11 is an explanatory view of the resistor of third embodiment.

FIG. 11 shows the resistor of third embodiment. In the embodiment, electrode 12b is formed to be like pipe, and the resistor has structure that both end portions of thin resistance body 11 is penetrated through inside of the electrode 12b. In the embodiment, by making diameter of resistance body 11 thin, resistance variation according to skin effect when high frequency current flowing through can be suppressed.
And, since the resistor has structure that resistance body penetrates through inside of electrode 12b, application of swaging processing (pillar-shaped resistance body is inserted into pipe-like electrode, and pressure is applied to outside of the electrode, then resistance body and electrode are fixed) becomes possible. Also, application of thermal fitting (expanding a hole of electrode like pipe by applying heat, inserting resistance body into the hole and cooling, and then electrode and resistance body are fixed) can be possible.

Figure 12:
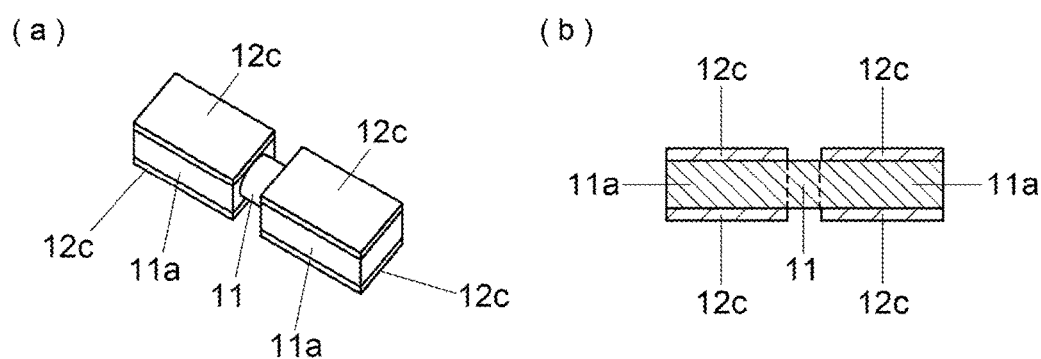
FIG. 12 is an explanatory view of the resistor of fourth embodiment.

FIG. 12 shows the resistor of fourth embodiment. In the embodiment, the resistance body includes columnar resistance body 11 at central portion and flat resistor bodies 11a at both ends thereof. Plate-shaped electrodes 12c are fixed on both upper and lower surfaces of flat resistance body 11a. Therefore, the structure that has thin columnar resistance body at central portion and square-pillar electrodes at both ends thereof is common with above-mentioned embodiments. In the embodiment, by having square-pillar electrode 12c, advantages such as easy surface mounting and improvement of heat radiation are common with above-mentioned embodiments.

Further, regarding to above-mentioned voltage terminal members 3 and 5, voltage terminal portions 3a, 5a are shown as structures erecting vertically. However, voltage terminal portions 3a, 5a may be not erecting vertically but be flat. By making connecting portion 21 of connector 20 to connect to flat voltage terminal portions 3a, 5a, similar functions and advantages can be obtained.

Similarly, it is illustrated that extending portion includes first extending portion 3c1, 5c1, which extends from connecting portion toward the other electrode side, and second extending portion 3c2, 5c2, which extends from first extending portion in right-angled direction to direction where electrodes are disposed. However, extending portion, which extends from connecting portion toward the other electrode side, only has to reach to straight line L, for example, at center between the electrodes 12, which is perpendicular to direction where the electrodes are disposed (see FIG. 8), and voltage terminal portions 3a, 5a are formed on both ends, then similar functions and advantages can be obtained.

Although embodiments of the invention has been explained, however the invention is not limited to above embodiments, and various changes and modifications may be made within scope of the technical concepts of the invention.

INDUSTRIAL APPLICABILITY

The invention can be used for the resistors for detecting current by detecting voltage between both ends of resistance body caused by the current to be watched.

The invention claimed is:
1. A resistor for detecting current, comprising:
a resistance body;
a pair of electrodes fixed to each end of the resistance body; and
a pair of voltage terminal members for detecting voltage generated in the resistance body and that are connected to each electrode;
wherein the voltage terminal member includes a connecting portion for connecting to the electrode, and an extending portion extending from the connecting portion toward the other electrode side;
wherein each end of the extending portion reaches to a same plane perpendicular to the current path between the electrodes; and
wherein the voltage terminal member includes a connecting portion for connecting to the electrode, first extending portion extending from the connecting portion toward the other electrode side, second extending portion extending from the first extending portion in right-angled direction to direction where the electrodes are disposed, and a voltage terminal portion erecting vertically on an end of the second extending portion.

2. The resistor for detecting current of claim 1, further comprising a voltage terminal portion erecting on an end of the extending portion.

3. The resistor for detecting current of claim 1, wherein the connecting portion is connected to an end face of the electrode of the resistance body side.

4. The resistor for detecting current of claim 1, further comprising an insulative member disposed between the pair of the voltage terminal members.

5. The resistor for detecting current of claim 1, wherein the resistance body is configured to be pillar-shaped between the electrodes and that has diameter of 4 mm or less.

* * * * *